United States Patent
Chu et al.

(10) Patent No.: US 7,811,146 B2
(45) Date of Patent: Oct. 12, 2010

(54) FABRICATION METHOD OF ACTIVE MATRIX ORGANIC ELECTRO-LUMINESCENT DISPLAY PANEL

(75) Inventors: Wen-Kuo Chu, Taipei (TW); Bao-Jen Ann, Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 267 days.

(21) Appl. No.: 11/938,791

(22) Filed: Nov. 13, 2007

(65) Prior Publication Data

US 2008/0070466 A1    Mar. 20, 2008

Related U.S. Application Data

(62) Division of application No. 10/711,544, filed on Sep. 24, 2004, now Pat. No. 7,319,290.

(51) Int. Cl.
*H01J 9/24* (2006.01)
(52) U.S. Cl. .................... 445/24; 313/504; 313/506; 313/509
(58) Field of Classification Search ............. 445/24; 313/498–512
See application file for complete search history.

(56) References Cited

U.S. PATENT DOCUMENTS

2004/0090175 A1* 5/2004 Urabe et al. ............... 313/504
2005/0059185 A1* 3/2005 Yuki et al. ................. 438/48
2006/0012708 A1* 1/2006 Rosmalen .................. 348/503

FOREIGN PATENT DOCUMENTS

| CN | 1347266 | 5/2002 |
|---|---|---|
| CN | 1507614 | 6/2004 |
| WO | WO2004025616 | * 3/2004 |

* cited by examiner

*Primary Examiner*—Bumsuk Won
(74) *Attorney, Agent, or Firm*—Jianq Chyun IP Office

(57) ABSTRACT

An active matrix organic electro-luminescent display (AMOELD) panel comprising a substrate, a pixel structure, an organic light-emitting layer and a cathode pattern layer is provided. The pixel structure layer is disposed over the substrate. The pixel structure layer further comprises an active device matrix and an anode pattern layer. The organic light-emitting layer covers at least the anode pattern layer and comprises at least a first organic light-emitting pattern, at least a second organic light-emitting pattern and at least a third organic light-emitting pattern. The cathode pattern layer is disposed on the organic light-emitting layer. The cathode pattern layer comprises a first cathode pattern disposed on the first organic light-emitting pattern, a second cathode pattern disposed on the second organic light-emitting pattern and a third cathode pattern on the third organic light-emitting pattern. Furthermore, the first, the second and the third cathode pattern are not connected to each other.

8 Claims, 5 Drawing Sheets

FABRICATION METHOD OF ACTIVE MATRIX ORGANIC ELECTRO-LUMINESCENT DISPLAY PANEL

CROSS-REFERENCE TO RELATED APPLICATION

This application is a divisional of an application Ser. No. 10/711,544, filed on Sep. 24, 2004, now allowed. The entirety of each of the above-mentioned patent applications is hereby incorporated by reference herein and made a part of this specification.

BACKGROUND OF THE INVENTION

1. Field of the Invention

The present invention generally relates to a display panel and fabrication method thereof. More particularly, the present invention relates to an active matrix organic electro-luminescent display (AMOELD) panel and manufacturing method thereof.

2. Description of the Related Art

Telecommunication has become an important activity in our society thanks to the development of various communication and display products. Because display panel is an indispensable man-machine interface in communication, its development is particularly important. Among the display panels, organic electro-luminescent display (OELD) has the greatest potential for further development because it has many advantages including a self-illuminating screen, wide viewing angle, a low power rating, a wide temperature operating range, a high response speed and full coloration. Moreover, the OELD panel is easy to fabricate and has a low cost of production.

Organic electro-luminescent display (OELD) panel is a display that utilizes the self-illuminating property of an organic light-emitting material to illuminate an image. According to the molecular weight of the organic light-emitting material, the OELD panel can be classified into small molecule organic electro-luminescent display (SM-OELD) and polymer electro-luminescent display (PELD). The light-emitting structure of both types of OELD comprises a pair of electrodes and an organic material layer sandwiched between the two. When a DC voltage is applied to the electrodes, holes are injected from the anode into the organic light-emitting material layer while electrons are injected from the cathode into the organic light-emitting material layer. Due to the potential produced by an external electric field, hole and electron carriers moving inside the organic light-emitting material layer may collide and recombine with each other. A portion of the energy released by the recombination of electron-hole pairs may excite the organic light-emitting molecules into an excited state. When an excited molecule releases its energy and falls back to a ground state, a definite portion of the energy is released as photons. Hence, the organic electro-luminescent display (OELD) panel will emit light on activation.

In recent years, an active matrix organic light-emitting display (AMOLED) is being actively developed. The AMOLED panel is fabricated by forming an anode layer, an organic light-emitting material layer and a cathode layer sequentially over a substrate having a plurality of thin film transistors thereon. It should be noted that the cathode layer is formed over the organic light-emitting material layer globally. With this design, the cathode provides a common operating voltage. However, because the light-emitting efficiency, preferred operating voltage and brightness attenuation are not identical for different organic material, the design of the cathode layer and the method of operating the cathode can hardly meet the demand for full coloration in a display device.

In the Japanese Patent No. 10-3199910, the current differential between a scan electrode and a common electrode is sampled and compared with a reference signal to determine the input current, thereby adjusting the brightness level. However, this type of design has a rather complicated circuit. In another Japanese Patent No. 11-073158, a different number of light-emitting devices are used in different color pixel areas to combat any variation in light emission and hence the brightness level. Although this method is capable of bringing the brightness level of different colors closer together, the changes in pixel areas often leads to a difference in picture contrast and a lowering of resolution and complicates the design of the driving circuits. In yet another Japanese Patent No. 11-073159, a transformation table relating the display data with the properties of various materials is set up. According to the input signal, a voltage corresponding to the material is generated to bring the brightness level closer together. However, one major defect is that slight modification of the material properties may invalidate the transformation table.

SUMMARY OF THE INVENTION

Accordingly, the present invention is directed to an active matrix organic electro-luminescent display (AMOELD) panel capable of reducing brightness variation due to a difference in light emission efficiency between various organic light-emitting materials so that the image displaying quality of the panel is improved.

The present invention is directed to a method of fabricating an active matrix organic electro-luminescent display (AMOELD) panel capable of reducing brightness variation due to a difference in light emission efficiency between various organic light-emitting materials. Hence, the image displaying quality of the panel is improved.

According to an embodiment of the present invention, an active matrix organic electro-luminescent display (AMOELD) panel is provided. The AMOELD panel comprises a substrate, a pixel structure layer, an organic light-emitting layer and a cathode pattern layer. The pixel structure layer is disposed over the substrate. The pixel structure layer further comprises an active device matrix and an anode pattern layer. In addition, the organic light-emitting layer covers at least the anode pattern layer and comprises at least a first organic light-emitting pattern, at least a second organic light-emitting pattern and at least a third organic light-emitting pattern. The cathode pattern layer is disposed over the organic light-emitting layer. The cathode pattern layer comprises a first cathode pattern disposed on the first organic light-emitting pattern, a second cathode pattern disposed on the second organic light-emitting pattern and a third cathode pattern disposed on the third organic light-emitting pattern. Furthermore, the first, the second and the third cathode pattern are not connected to each other.

According to another embodiment of the present invention, a method of fabricating an active matrix organic electro-luminescent display (AMOELD) panel is provided. First, a pixel structure layer is formed over a substrate. The method of forming pixel structure layer comprises forming an active device matrix and an anode pattern layer in sequence over the substrate and then forming an organic light-emitting layer over the substrate to cover at least the anode pattern layer. The organic light-emitting layer comprises at least a first organic light-emitting pattern, at least a second organic light-emitting pattern and at least a third organic light-emitting pattern.

Thereafter, a cathode pattern layer is formed over the organic light-emitting layer. The cathode pattern layer comprises a first cathode pattern disposed on the first organic light-emitting pattern, a second cathode pattern disposed on the second organic light-emitting pattern and a third cathode pattern on the third organic light-emitting pattern. Furthermore, the first, the second and the third cathode pattern are not connected to each other.

In brief, the active matrix organic electro-luminescent display (AMOELD) panel of the present invention utilizes a patterned cathode layer to provide a different operating voltage to each organic light-emitting material so that the display quality of the panel is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1B is a schematic cross-sectional view showing a representative section of the active matrix organic electro-luminescent display panel according to the first preferred embodiment of the present invention, wherein FIG. 1B is the schematic cross-sectional view along D-D', E-E' and F-F' of FIG. 1A.

FIG. 2B is a schematic cross-sectional view showing a representative section of the active matrix organic electro-luminescent display panel according to the second preferred embodiment of the present invention, wherein FIG. 2B is the schematic cross-sectional view along D-D', E-E' and F-F' of FIG. 2A.

DESCRIPTION OF THE PREFERRED EMBODIMENTS

Figure 1A:
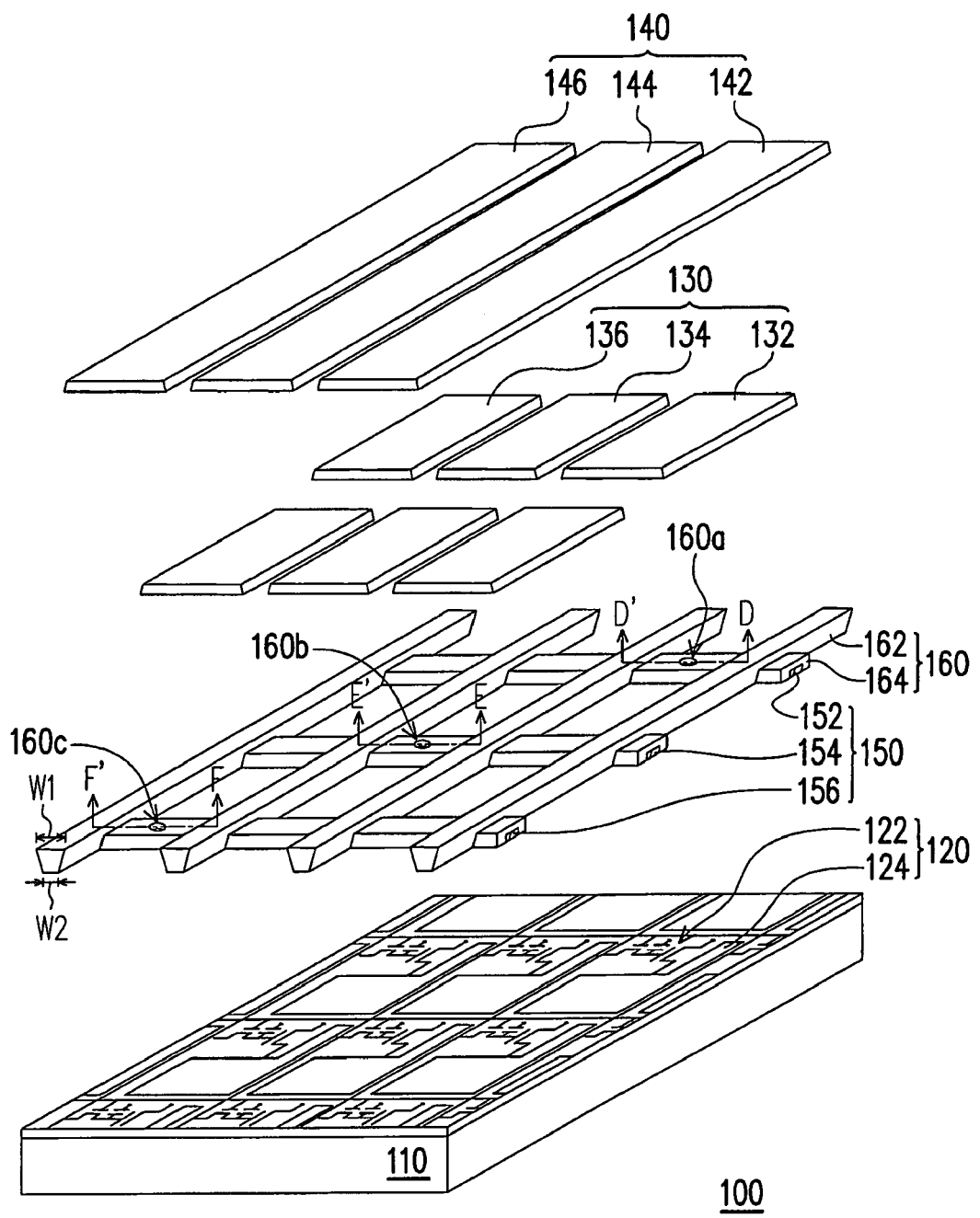
FIG. 1A is a perspective view showing the structural layout of an active matrix organic electro-luminescent display panel according to a first preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention utilizes a patterned cathode layer to provide an operating voltage to different types of organic light-emitting materials each having a different set of material properties, light-emitting efficiency and brightness level so that the panel can have a better overall display quality. The structure and fabricating method of an active matrix organic electro-luminescent display panel described in the following is used as an illustration only. It should by no means limit the scope of the present invention because anyone having an understanding of the technique may provide appropriate modifications when needed.

First Embodiment

Figure 1B:
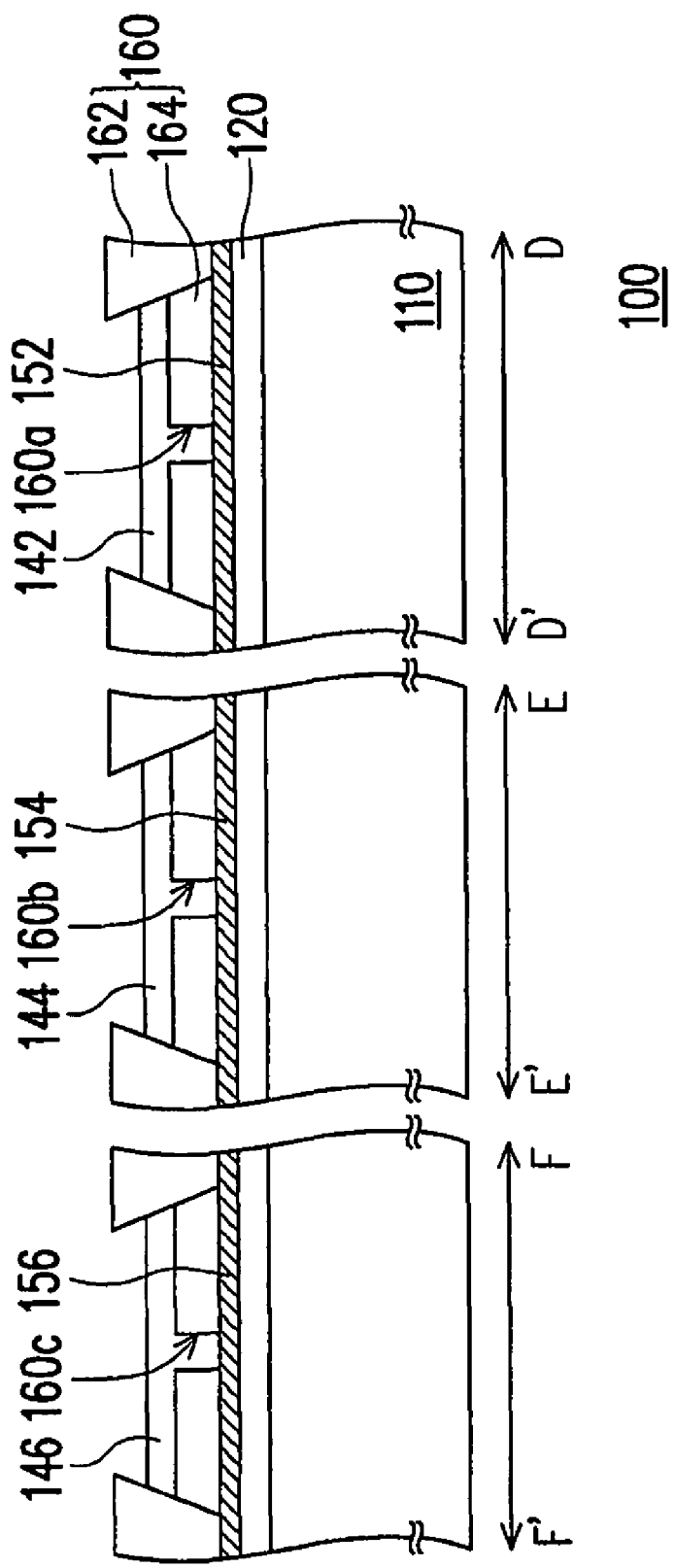

FIG. 1A is a perspective view showing the structural layout of an active matrix organic electro-luminescent display panel according to a first preferred embodiment of the present invention. FIG. 1B is a schematic cross-sectional view showing a representative section of the active matrix organic electro-luminescent display panel according to the first preferred embodiment of the present invention, wherein FIG. 1B is the schematic cross-sectional view along D-D', E-E' and F-F' of FIG. 1A. As shown in FIGS. 1A and 1B, the active matrix organic electro-luminescent display (AMOELD) panel 100 comprises a substrate 110, a pixel structure layer 120, an organic light-emitting layer 130 and a cathode pattern layer 140. The pixel structure layer 120 is disposed on the substrate 110. The pixel structure layer 120 comprises an active device matrix 122 and an anode pattern layer 124, for example. The active device matrix 122 is a thin film transistor array and the anode pattern layer 124 is fabricated using an indium-tin-oxide (ITO) compound or an indium-zinc-oxide (IZO) compound, for example.

The organic light-emitting layer 130 covers at least the anode pattern layer 124. The organic light-emitting layer 130 comprises at least a first organic light-emitting pattern 132, at least a second organic light-emitting pattern 134 and at least a third organic light-emitting pattern 136. The cathode pattern layer 140 is disposed on the organic light-emitting pattern layer 130. The cathode pattern layer 140 comprises a first cathode pattern 142 disposed on the first organic light-emitting pattern 132, a second cathode pattern 144 disposed on the second organic light-emitting pattern 134 and a third cathode pattern 146 disposed on the third organic light-emitting pattern 136. Furthermore, the first cathode pattern 142, the second cathode pattern 144 and the third cathode pattern 146 are not connected to each other as shown in FIG. 1A.

The AMOELD panel 100 may optionally comprise a plurality of cathode lines 150 and a partition rib structures 160. The cathode lines 150 comprises a first cathode line 152, a second cathode line 154 and a third cathode line 156 electrically connected to the first cathode pattern 142, the second cathode pattern 144 and the third cathode pattern 146 respectively as shown in FIG. 1B. In addition, the partition rib structures 160 are disposed over the active device matrix 122 and the anode pattern layer 124 so that the first organic light-emitting pattern 132, the second organic light-emitting pattern 134 and the third organic light-emitting pattern 136 are separated from each other. Furthermore, the partition rib structures 160 also separate the first cathode pattern 142, the second cathode pattern 144 and the third cathode pattern 146 from each other.

It should be noted that the partition rib structures 160 comprise a first partition rib 162 and a second partition rib 164. The first partition rib 162 and the second partition rib 164 cross each other. Furthermore, the partition rib structure 160 has a first contact opening 160a, a second contact opening 160b and a third contact opening 160c separately disposed at the junction between the first cathode pattern 142, the second cathode pattern 144, the third cathode pattern 146 and the second partition rib 164. Thus, the first cathode pattern 142, the second cathode pattern 144 and the third cathode pattern 146 are electrically connected to the first cathode line 152, the second cathode line 154 and the third cathode line 156 through the first contact opening 160a, the second contact opening 160b and the third contact opening 160c. In other words, the first cathode pattern 142, the second cathode pattern 144 and the third cathode pattern 146 are electrically connected to a corresponding operating voltage. In addition, the first organic light-emitting pattern 132, the second organic light-emitting pattern 134 and the third organic light-emitting pattern 136 are fabricated, for example, using red light-emitting material, green light-emitting material and blue light-emitting material respectively.

In general, the preferred operating voltage for the first organic light-emitting pattern 132, the second organic light-emitting pattern 134 and the third organic light-emitting pattern 136 are different. Through the first cathode pattern 142, the second cathode pattern 144 and the third cathode pattern 146, a different operating voltage is provided to each of the first organic light-emitting pattern 132, the second organic light-emitting pattern 134 and the third organic light-emitting pattern 136. Hence, the difference in light-emitting efficiency and brightness level attenuation due to the variability of organic material properties is greatly reduced and the AMOELD panel 100 can have a more uniform brightness level. Furthermore, the cathode lines 150 are electrically connected to a driving chip (not shown) on the periphery circuit region. Therefore, as long as the driving chip is provided with leads electrically connecting to the cathode lines 150, the driving chip can control the operating voltage of the first cathode pattern 142, the second cathode pattern 144 and the third cathode pattern 146. It should be noted that the rate of degradation of organic materials is quite different. Thereafter, after using the AMOELD panel 100 of the present invention for some time, a user can re-condition the panel by adjusting the operating voltage of the organic material.

The steps for fabricating the AMOELD 100 as shown in FIGS. 1A and 1B includes the following steps. First, an active device matrix 122 and an anode pattern layer 124 are sequentially formed over a substrate 110. The active device matrix 122 and the anode pattern layer 124 together form a pixel structure layer 120. A plurality of cathode lines 150 is formed over the substrate 110. The cathode lines 150 are formed, for example, by carrying out a wire jumper process or other suitable process so that the cathode lines 150 are prevented from connecting with the active device matrix 122 or the anode pattern layer 124 electrically. Thereafter, partition rib structures 160 each having a plurality a first partition rib 162 and a second partition rib 164 are formed over the substrate 110. The process of fabricating the pattern rib structures 160 includes, for example, forming a photoresist layer (not shown) over the substrate 110, exposing the photoresist layer and finally chemically developing the exposed photoresist layer. As shown in FIG. 1A, a first contact opening 160a, a second contact opening 160b and a third contact opening 160c are also formed at the junction between the first cathode line 152, the second cathode line 154, the third cathode line 156 and the second partition rib 164. However, the first contact opening 160a, the second contact opening 160b and the third contact opening 160c can be formed at a later stage, perhaps, after the subsequent forming of an organic light-emitting layer 130.

It should be noted that the first partition rib 162 of the partition rib structures 160 must have a sufficient thickness for isolating various pattern layers when the organic light-emitting layer 130 and the cathode pattern layer 140 are subsequently formed. Preferably, the top surface width W1 of the first partition rib 162 is greater than its bottom surface width W2. Furthermore, the first contact opening 160a, the second contact opening 160b and the third contact opening 160c exposes a portion of the first cathode line 152, the second cathode line 154 and the third cathode line 156 respectively. After forming the partition rib structures 160, an organic light-emitting layer 130 is formed over the substrate 110. The organic light-emitting layer 130 covers at least the anode pattern layer 124. The organic light-emitting layer 130 comprises at least a first organic light-emitting pattern 132, at least a second organic light-emitting pattern 134 and at least a third organic light-emitting pattern 136. The organic light-emitting layer 130 can be fabricated using any known methods. If the AMOELD panel 100 is applied to a small molecular organic electro-luminescent display (SM-OELD), the organic light-emitting layer 130 is formed in an evaporation process, for example. On the other hand, if the AMOELD panel 100 is applied to a polymer electro-luminescent device (PELD), the organic light-emitting layer 130 is formed in a spin-coating process or an ink-jet process for example.

After forming the organic light-emitting layer 130, a cathode deposition process is carried out to from a cathode pattern layer 140 over the substrate 110. Because the first partition rib 162 of the partition rib structures 160 has a definite thickness, the cathode pattern layer 140 is partitioned into a first cathode pattern 142, a second cathode pattern 144 and a third cathode pattern 146 by the first partition rib 162. Moreover, the first cathode pattern 142, the second cathode pattern 144 and the third cathode pattern 146 are disposed on the first organic light-emitting pattern 132, the second organic light-emitting pattern 134 and the third organic light-emitting pattern 136 respectively. It should be noted that the first cathode pattern 142, the second cathode pattern 144 and the third cathode pattern 146 are electrically connected to the first cathode line 152, the second cathode line 154 and the third cathode line 156 through the first contact opening 160a, the second contact opening 160b and the third contact opening 160c respectively. Hence, each of the first cathode pattern 142, the second cathode pattern 144 and the third cathode pattern is electrically connected to a corresponding operating voltage.

Second Embodiment

Figure 2A:
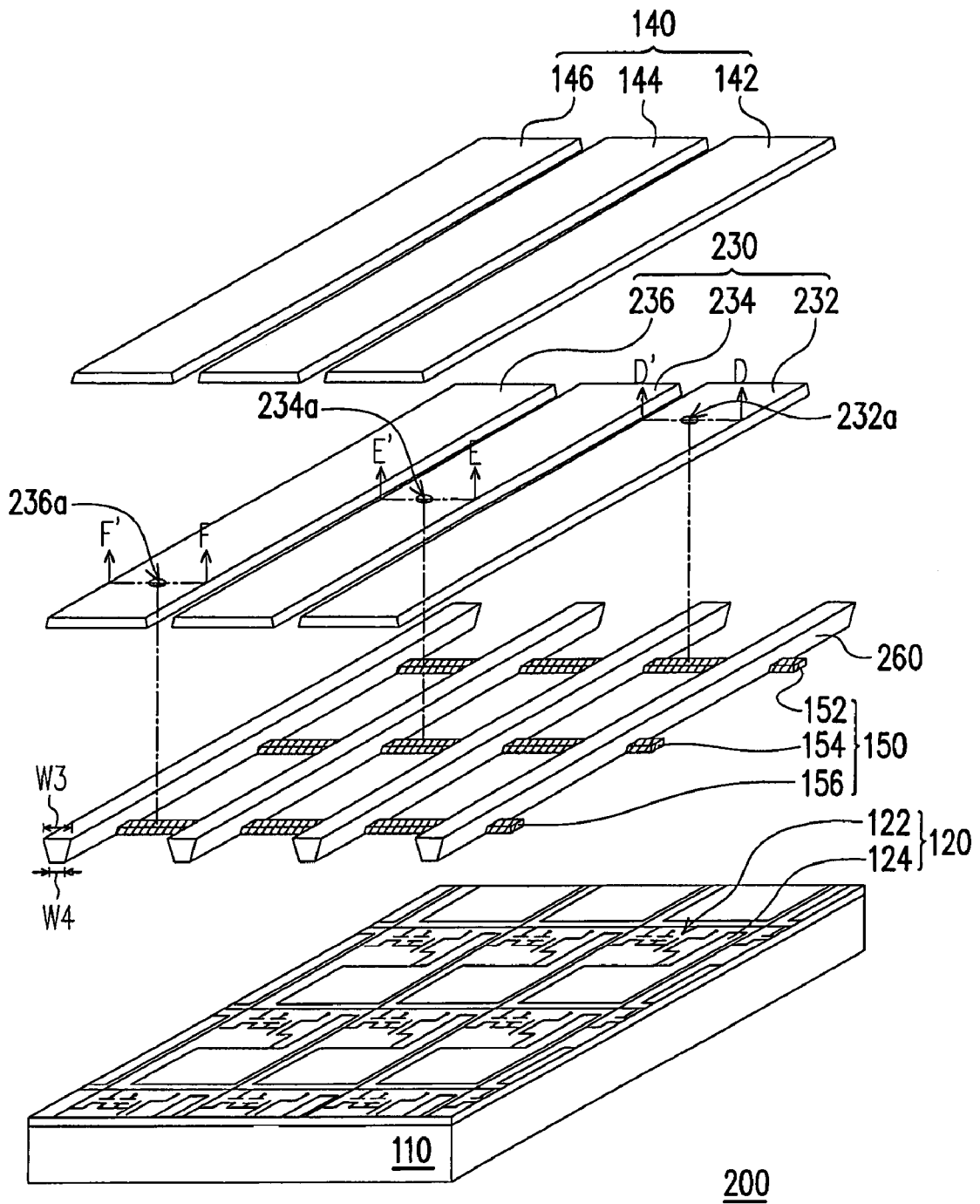
FIG. 2A is a perspective view showing the structural layout of an active matrix organic electro-luminescent display panel according to a second preferred embodiment of the present invention.
Figure 2B:
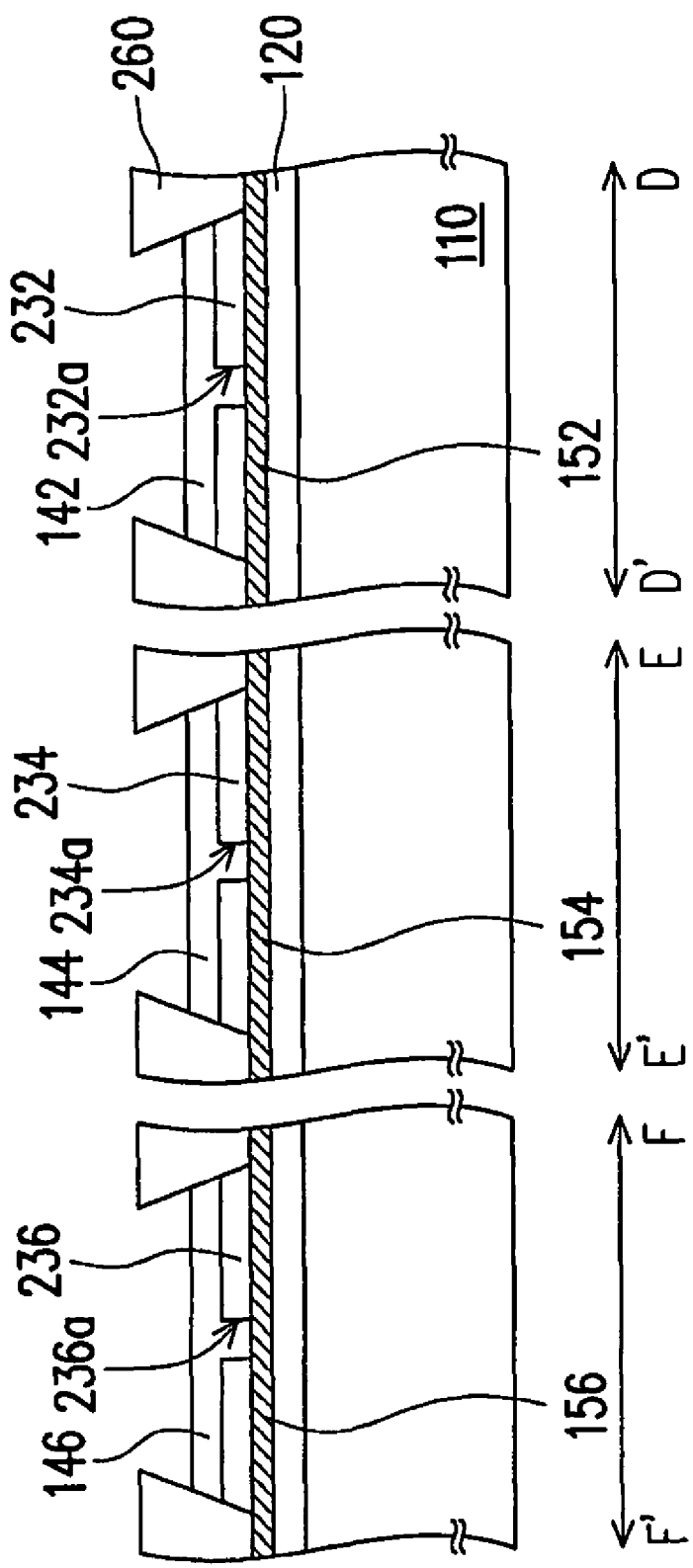

FIG. 2A is a perspective view showing the structural layout of an active matrix organic electro-luminescent display panel according to a second preferred embodiment of the present invention. FIG. 2B is a schematic cross-sectional view showing a representative section of the active matrix organic electro-luminescent display panel according to the second preferred embodiment of the present invention, wherein FIG. 2B is the schematic cross-sectional view along D-D', E-E' and F-F' of FIG. 2A. In the second embodiment, components identical to the one in the first embodiment are labeled identically. As shown in FIGS. 2A and 2B, the AMOELD panel 200 in the second embodiment is very similar to the AMOELD panel 100 in the first embodiment. One major different is that while the first organic light-emitting pattern 132, the second organic light-emitting pattern 134 and the third organic light-emitting pattern 136 are rectangular blocks (as shown in FIG. 1A) in the first embodiment, the first organic light-emitting pattern 232, the second organic light-emitting pattern 234 and the third organic light-emitting pattern 236 are long strips (as shown in FIG. 2A) in the second embodiment. In addition, the first organic light-emitting pattern 232, the second organic light-emitting pattern 234 and the third organic light-emitting pattern 236 have a first contact opening 232a, a second contact opening 234a and a third contact opening 236a disposed at the junction between the first cathode line 152, the second cathode line 154 and the third cathode line 156 on one hand and the first organic light-emitting pattern 232, the second organic light-emitting pattern 234 and the third organic light-emitting pattern 236 on the other. Furthermore, the first contact opening 232a, the second contact opening 234a and the third contact opening 236a expose the first cathode line 152, the second cathode line 154 and the third cathode line 156 as shown in FIG. 2B.

Furthermore, the partition rib structures 260 in the second embodiment are long strips that not only isolate the first organic light-emitting pattern 232, the second organic light-emitting pattern 234 and the third organic light-emitting pattern 236, but also isolate the first cathode pattern 142, the second cathode pattern 144 and the third cathode pattern 146. It should be noted that the first cathode pattern 142, the second cathode pattern 144 and the third cathode pattern 146 are electrically connected to a different operating voltage according to the material properties of the first organic light-emitting pattern 232, the second organic light-emitting pattern 234 and the third organic light-emitting pattern 236. Thus, the display quality of the AMOELD panel 200 is improved.

The method of fabricating the AMOELD panel 200 is very similar to the one in the first embodiment. After forming the pixel structure layer 120 and the cathode lines 150, partition rib structures 260 are formed over the substrate 110 as shown in FIGS. 2A and 2B. The partition rib structures 260 are long strips having a thickness large enough to partition the subsequently formed organic light-emitting layer 230 and cathode pattern layer 140. Preferably, the width W3 at the top surface of the partition rib structures 260 is greater than the width W4 at the bottom surface of the partition rib structures 260. Thereafter, an organic light-emitting layer 230 is formed over the substrate 110. The organic light-emitting layer 230 comprises at least a first organic light-emitting pattern 232, at least a second organic light-emitting pattern 234 and at least a third organic light-emitting pattern 236. The partition rib structures 260 isolate the first organic light-emitting pattern 232, the second organic light-emitting pattern 234 and the third organic light-emitting pattern 236 from each other.

After forming the organic light-emitting layer 230, the organic light-emitting layer 230 is patterned to form a first contact opening 232a, a second contact opening 234a and a third contact opening 236a in the first organic light-emitting pattern 232, the second organic light-emitting pattern 234 and the third organic light-emitting pattern 236 to expose a portion of the first cathode line 152, the second cathode line 154 and the third cathode line 156 respectively as shown in FIG. 2B. Thereafter, a cathode pattern layer 140 is formed over the substrate 110. Because the partition rib structures 260 has a definite thickness, the cathode pattern layer 140 is partitioned into a first cathode pattern 142, a second cathode pattern 144 and a third cathode pattern 146 by the partition rib structures 260. Furthermore, the first cathode pattern 142, the second cathode pattern 144 and the third cathode pattern 146 are electrically connected to the first cathode line 152, the second cathode line 154, the third cathode line 156 through the first contact opening 232a, the second contact opening 234a and the third contact opening 236a respectively.

In the present invention, the method of partitioning the cathode pattern layer 140 is not limited to the partition rib structures 260 or 160. Other methods capable of patterning the cathode layer can be used as well. In addition, the cross-section of the partition rib structures 260 or 160 is also not limited to the one shown in FIG. 2A as long as the structure is capable of separating the cathode layer when a cathode deposition process is carried out. Furthermore, the cathode lines 150 are not limited to a location between the pixel structure layer 120 and the partition rib structures 260. Other locations may be selected as long as the first cathode pattern 142, the second cathode pattern 144 and the third cathode pattern 146 are electrically connected to a corresponding operating voltage.

Figure 3:
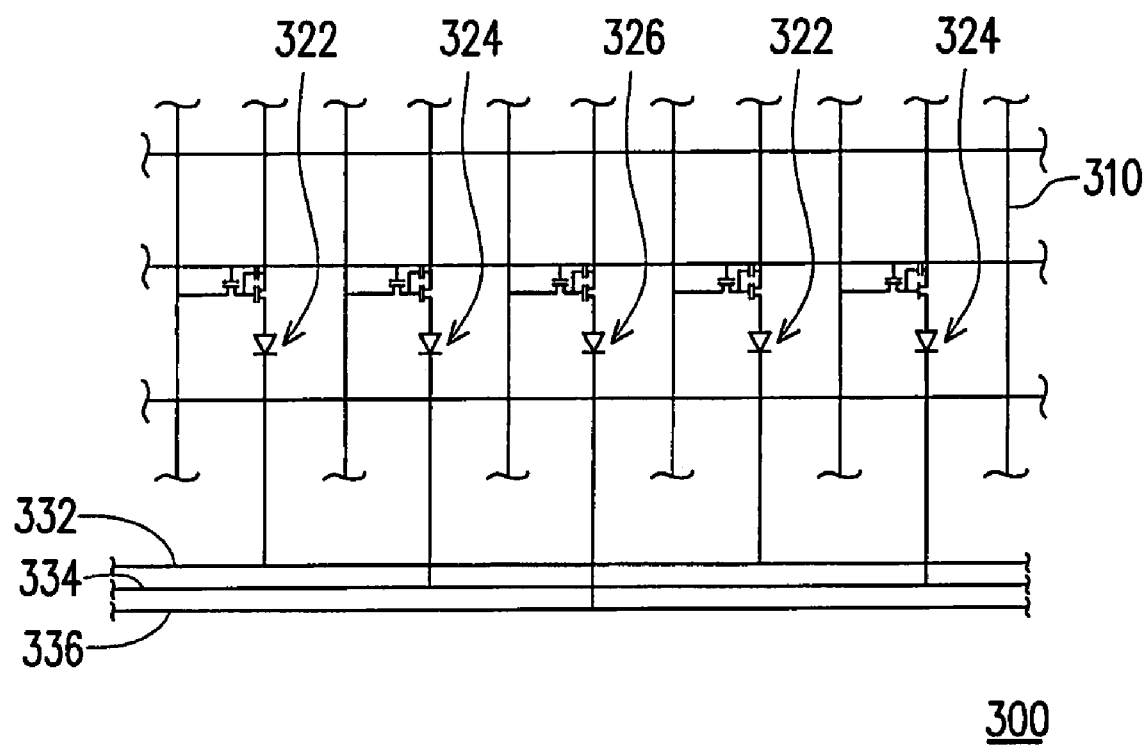
FIG. 3 is a circuit diagram of an active organic electro-luminescent display panel according to the present invention.

FIG. 3 is an equivalent circuit diagram of the active organic electro-luminescent display panel shown in FIGS. 1A and 2A according to the present invention. As shown in FIG. 3, the AMOELD panel circuit 300 comprises an active device matrix 310, a plurality of first organic electro-luminescent devices 322, a plurality of second organic electro-luminescent devices 324, a plurality of third organic electro-luminescent devices 326, a first cathode line 332, a second cathode line 334 and a third cathode line 336. The first organic electro-luminescent device 322, the second organic electro-luminescent device 324 and the third organic electro-luminescent device 326 are electrically connected to the first cathode line 332, the second cathode line 334 and the third cathode line 336 respectively. It should be noted that the first cathode line 332, the second cathode line 334 and the third cathode line 336 each provides a different operating voltage to the first organic electro-luminescent device 322, the second organic electro-luminescent device 324 and the third electro-luminescent device 326.

In summary, major advantages of the AMOELD panel and the manufacturing method thereof includes:

1. The AMOELD panel has a patterned cathode layer so that a different operating voltage can be applied according to the light-emitting efficiency of the type of organic material. Hence, The AMOELD panel has a uniform brightness.

2. The patterned cathode layer is electrically connected to a driving chip so that the operating voltage applied to the cathode lines can be adjusted through the driving chip.

3. Because the rate of degradation of organic materials differs from each other, the user may adjust the operating voltage after a period of time when the colors on the panel have changed so that the same display quality is maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an active matrix organic electro-luminescent display panel, comprising:

forming a pixel structure layer over a substrate, wherein the process of forming the pixel structure layer comprises forming an active device matrix and an anode pattern layer sequentially over the substrate;

forming a plurality of cathode lines over the substrate, wherein the cathode lines comprise a first cathode line, a second cathode line and a third cathode line;

forming a partition rib structure over the substrate, wherein the partition rib structure is disposed over the cathode lines and covers the first, second, and third cathode lines;

forming a first, a second, and a third contact openings in the partition rib structure at the junction between a cathode pattern layer and the partition rib structure, wherein the first, second, and third contact openings are disposed in the partition rib structure;

forming an organic light-emitting layer over the substrate to cover at least the anode pattern layer, wherein the organic light-emitting layer comprises at least a first organic light-emitting pattern, at least a second organic light-emitting pattern and at least a third organic light-emitting pattern, and the first, second and third cathode lines are sandwiched between the pixel structure layer and the organic light-emitting layer; and forming the cathode pattern layer over the organic light-emitting layer, wherein the cathode pattern layer comprises a first cathode pattern formed on the first organic light-emitting pattern, a second cathode pattern formed on the second organic light-emitting pattern and a third cathode pattern formed on the third organic light-emitting pattern, the first, second and third cathode lines are electrically connected to the first, the second and the third cathode patterns respectively through the first, second and third contact openings, and the first, the second and the third cathode patterns are disconnected from each other, wherein the first cathode pattern is electrically connected to a first voltage, the second cathode pattern is electrically connected to a second voltage, the third cathode pattern is electrically connected to a third voltage, and the first voltage, the second voltage and the third voltage are different from each other.

2. The method of claim 1, wherein the step of forming the cathode pattern layer comprises performing a cathode deposition process such that the first, the second and the third cathode patterns are separated from each other by the partition rib structure.

3. The method of claim 1, wherein before the step of forming the organic light-emitting layer, further comprises forming a partition rib structure over the active device matrix and the anode pattern layer.

4. The method of claim 3, wherein the step of forming the organic light-emitting layer comprises performing an ink-jet process.

5. The method of claim 3, wherein the step of forming the cathode pattern layer comprises performing a cathode deposition process such that the first, the second and the third cathode patterns are separated from each other by the partition rib structure.

6. A method of fabricating an active matrix organic electroluminescent display panel, comprising:

forming a pixel structure layer over a substrate, wherein the process of forming the pixel structure layer comprises forming an active device matrix and an anode pattern layer sequentially over the substrate;

forming a plurality of cathode lines over the substrate, wherein the cathode lines comprise a first cathode line, a second cathode line and a third cathode line;

forming a partition rib structure over the active device matrix and the anode pattern layer, wherein the partition rib structure partially covers the first, second and third cathode lines;

forming an organic light-emitting layer over the substrate to cover at least the anode pattern layer, wherein the organic light-emitting layer comprises at least a first organic light-emitting pattern, at least a second organic light-emitting pattern, and at least a third organic light-emitting pattern, and the first, second and third cathode lines are sandwiched between the pixel structure layer and the organic light-emitting layer;

patterning the organic light-emitting layer to form a first, a second, and a third contact openings in the first, the second, and the third organic light-emitting patterns respectively; and forming a cathode pattern layer over the organic light-emitting layer, wherein the cathode pattern layer comprises a first cathode pattern formed on the first organic light-emitting pattern, a second cathode pattern formed on the second organic light-emitting pattern, and a third cathode pattern formed on the third organic light-emitting pattern, the first, the second, and the third contact openings are disposed in the first, the second, and the third organic light-emitting patterns, such that the first, the second, and the third cathode patterns are electrically connected to the first, the second, and the third cathode lines which are exposed by the partition rib structure respectively through the first, the second, and the third contact openings, and the first, the second and the third cathode patterns are disconnected from each other, wherein the first cathode pattern is electrically connected to a first voltage, the second cathode pattern is electrically connected to a second voltage, the third cathode pattern is electrically connected to a third voltage, and the first voltage, the second voltage, and the third voltage are different from each other.

7. The method of claim 6, wherein the step of forming the organic light-emitting layer comprises performing an ink jet process.

8. The method of claim 6, wherein the step of forming the cathode pattern layer comprises performing a cathode deposition process, such that the first, the second and the third cathode patterns are separated from each other by the partition rib structure.

* * * * *